(12) United States Patent
Hedler et al.

(10) Patent No.: US 6,897,088 B2
(45) Date of Patent: May 24, 2005

(54) METHOD FOR CONNECTING CIRCUIT DEVICES

(75) Inventors: Harry Hedler, Germering (DE); Roland Irsigler, Munich (DE); Jens Pohl, Bernhardswald (DE)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 10/440,480

(22) Filed: May 15, 2003

(65) Prior Publication Data

US 2004/0007782 A1 Jan. 15, 2004

(30) Foreign Application Priority Data

May 15, 2002 (DE) .......................................... 102 21 646

(51) Int. Cl.[7] .............................................. H01L 21/44
(52) U.S. Cl. ....................... 438/102; 438/108; 438/109; 257/777; 257/778
(58) Field of Search .......................... 438/112, 108–109; 257/777–783

(56) References Cited

U.S. PATENT DOCUMENTS

| | | |
|---|---|---|
| 5,323,060 A | 6/1994 | Fogal et al. |
| 5,557,120 A | 9/1996 | Martin et al. |
| 5,783,465 A | 7/1998 | Canning et al. |
| 5,804,882 A * | 9/1998 | Tsukagoshi et al. ........ 257/783 |
| 6,005,778 A | 12/1999 | Spielberger et al. |
| 6,271,059 B1 | 8/2001 | Bertin et al. |
| 6,340,846 B1 | 1/2002 | LoBianco et al. |
| 6,380,629 B1 | 4/2002 | Kim |
| 6,472,758 B1 * | 10/2002 | Glenn et al. ................. 257/777 |
| 6,593,662 B1 * | 7/2003 | Pu et al. ...................... 257/777 |
| 6,753,613 B2 * | 6/2004 | Levardo et al. ............. 257/780 |

FOREIGN PATENT DOCUMENTS

WO    WO 01/75969    10/2001

* cited by examiner

Primary Examiner—Dung A. Le
(74) Attorney, Agent, or Firm—Fish & Richardson P.C.

(57) ABSTRACT

A method of connecting a first and second circuit device includes providing a first circuit device having a first main area and a second circuit device having a second and a third main area. A spacer device is disposed on one of the first and second circuit devices to ensure a predetermined spacing between the first and second circuit devices. An adhesive is applied to at least one of the first main area and the second main area and the first and second circuit devices are aligned and joined. The adhesive is then cured.

6 Claims, 7 Drawing Sheets

METHOD FOR CONNECTING CIRCUIT DEVICES

RELATED APPLICATIONS

This application claims the benefit of the May 15, 2002 priority date of German application DE 102.21.646.0, the contents of which are herein incorporated by reference.

1. Field of Invention

The present invention relates to a method of connecting circuit devices and to a corresponding assembly of circuit devices.

2. Background

Although the present invention can in principle be applied to any desired circuit devices or integrated circuits or semiconductor devices, such as DRAMs for instance, it and the problems on which it is based are presented with reference to semiconductor chips with integrated circuits using silicon technology.

Known methods of connecting chips with integrated circuits comprise the use of silicon spacers, which are adhesively attached onto the lower circuit device and then the following circuit device is adhesively attached onto this silicon spacing plate.

In the patent specification U.S. Pat. No. 5,323,060 there is disclosed a spacer between circuit devices which comprises an adhesive element which has a predetermined dimension, in order to achieve a spacing between the circuit devices.

The patent specification U.S. Pat. No. 6,005,778 discloses a spacer which is fastened between two circuit devices, respectively by means of an adhesive layer, and in particular provides an electrically conductive contact between the upper side of the first semiconductor device and the rear side of the second (upper) semiconductor device.

All these methods have the disadvantage that they are technologically demanding, to some extent cannot be used in parallel processes, for example at wafer level, unavoidably depend on the provision of wire bonds or bumps and to some extent use expensive materials.

Use of solder bumps for the spacing of two circuit devices has the disadvantage that additional contact pads have to be provided for this purpose. Furthermore, small solder bumps can usually only be created by means of electrochemical (galvanic) depositing of the solder. Together with the creation of a solder resist layer, this technology requires two additional lithographic steps. Furthermore, solder bumps are not mechanically stable enough, for which reason they have to be subsequently underfilled, which consequently makes the technology very expensive.

WO 01/75969 discloses a chip with an integrated circuit and a wiring device on a surface with metal-coated elevations for electrically connecting circuits, the elevations comprising a rubber-elastic material and respectively having a metallic contact pad on their tips and a line path on their sloping side or in their volume, which path is arranged between the contact pad and a conductor track. A major disadvantage of this arrangement is that elevations of a rubber-elastic material do not easily allow a precise spacing to be provided between two circuit devices.

SUMMARY

It is an object of the present invention to provide an easier and less costly method which creates a defined spacing between circuit devices in a corresponding assembly of circuit devices.

The idea on which the present invention is based is to provide a spacer device, in particular a directly bonding spacer device, which sets a predetermined spacing between two circuit devices.

For this purpose, before applying an adhesive to at least one mutually facing surface of a first and second circuit device, a spacer device is applied to one and/or both circuit devices, after which the two circuit devices are aligned with respect to each other, and the adhesive is cured for firmly connecting the first and second circuit devices.

The present invention leads to a less costly technology on account of the reduction in necessary process steps, since only two process steps are required for the connecting, that is the depositing of the spacer or spacers at predetermined locations, for example in a printing process, and the connecting of the opposing surfaces of the chips by the adhesive. Parallel processing of chips at wafer level is also possible. Finally, materials with low costs can be used.

Parallel processing is possible not only when depositing the spacer or spacers at wafer level, but also when producing the assembly using a hot plate—similar to a smoothing iron—for curing the connecting adhesive for a plurality of pairs of chips simultaneously.

According to a preferred development, a first wiring device is provided on the first main area of the first circuit device, and the second circuit device has a metallization with a plated-through hole or a second wiring device on its second main area, at least one portion of the spacer device being provided with a wiring device and aligned in such a way that a contact area on the spacer device electrically contacts the metallization or the second wiring device of the second circuit device.

According to a further preferred development, pressing together of the first and second circuit devices is performed with a predetermined pressure, so that the spacer device is slightly deformed.

According to a further preferred development, the curing of the adhesive takes place at least partly while the spacer device is deformed, so that a deformation is frozen in.

According to a further preferred development, the first circuit device is mounted on a substrate before the alignment.

According to a further preferred development, before the alignment, contact areas or bonding pads on the substrate are electrically connected to contact areas or bonding pads on the first circuit device.

According to a further preferred development, a multiplicity of pairs of a first and second circuit device are simultaneously aligned and respectively firmly connected to one another.

According to a further preferred development, the circuit devices are provided in wafer form, chip form or hybrid form.

The electrical contact is very stable when gold surfaces are used as contact areas, but titanium, copper, nickel and other metallic materials are also suitable as materials for the metallization. Epoxy resin with a relatively high modulus of elasticity is suitable in particular as a material for the spacer device, being of advantage for relatively rigid spacer devices to ensure a predetermined spacing in the connecting process, whereas a silicone with a relatively low modulus of elasticity is of advantage, for example, for spacer devices which are provided with an electrical contact element or with a wiring device.

BRIEF DESCRIPTION OF THE DRAWINGS

Exemplary embodiments of the invention are explained in more detail in the description which follows and are represented in the drawings, in which.

In the figures, the same reference numerals designate the same or functionally the same components.

DETAILED DESCRIPTION

Figure 1:
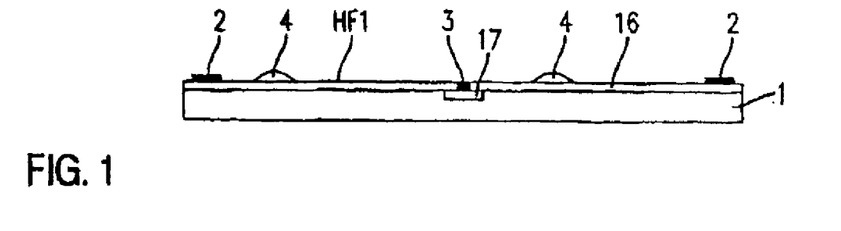
FIG. 1 shows the schematic representation of a cross section of a first chip with an integrated circuit using silicon technology after a method step according to a first embodiment of the present invention.

FIG. 1 shows the schematic representation of a cross section of a first chip with an integrated circuit using silicon technology after a method step according to a first embodiment of the present invention.

Represented in FIG. 1 is a circuit device 1, in particular a chip or a semiconductor device, which is provided with an insulating layer 16 on its first main area HF1. Contact areas 2 or bonding pads 2 have been applied on the insulating layer 16. A contact 3 is connected to the circuit device 1 by means of a terminal region 17. A spacer device 4 of a plastic, in particular epoxy resin, preferably with a relatively high modulus of elasticity (i.e. relatively rigid), has been applied in a punctiform manner or else in a relief structure, for example in a wafer level process, such as a printing process. The spacer device 4 may be cured or pre-cured directly after it has been deposited at predetermined points.

Figure 2:
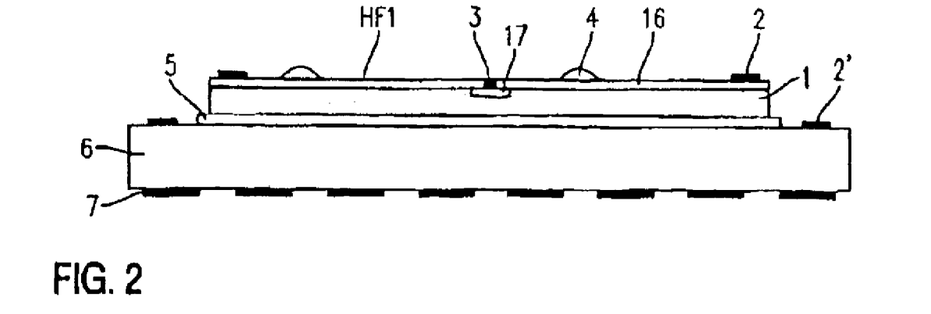
FIG. 2 shows the schematic representation of a cross section of the chip according to FIG. 1 after a subsequent method step according to a first embodiment of the present invention.

FIG. 2 shows the schematic representation of a cross section of the chip according to FIG. 1 after a subsequent method step according to a first embodiment of the present invention.

In FIG. 2, the first circuit device 1 has been mounted onto a substrate 6, which is connected to the circuit device 1 by means of a connecting layer 5. The substrate 6 has rear contact areas 7, which serve for the bonding to a peripheral circuit (not represented). Contact areas 2' or bonding pads 2' have been provided on the substrate 6. The contact areas 2' and the contact areas 7 are connected to one another by means of conductor tracks within the substrate 6.

Figure 3:
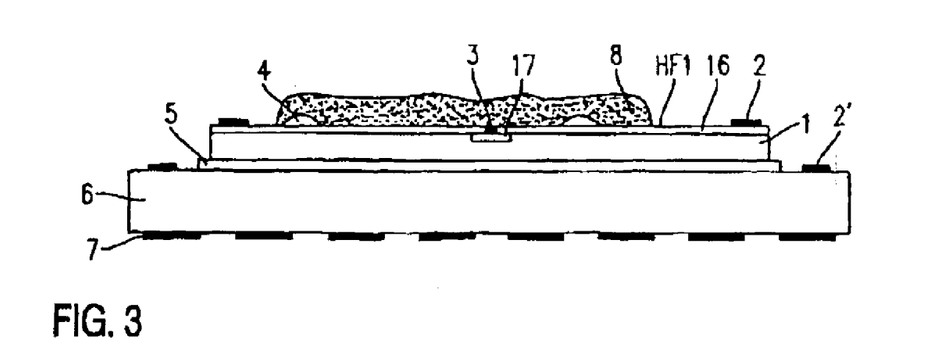
FIG. 3 shows the schematic representation of a cross section of the first chip according to FIG. 1 after applying an adhesive according to a first embodiment of the present invention.

FIG. 3 shows the schematic representation of a cross section of the first chip according to FIG. 1 after applying an adhesive according to a first embodiment of the present invention.

In FIG. 3, the arrangement according to FIG. 2 is represented after the application of an adhesive 8 onto the first main area HF1.

Figure 4:
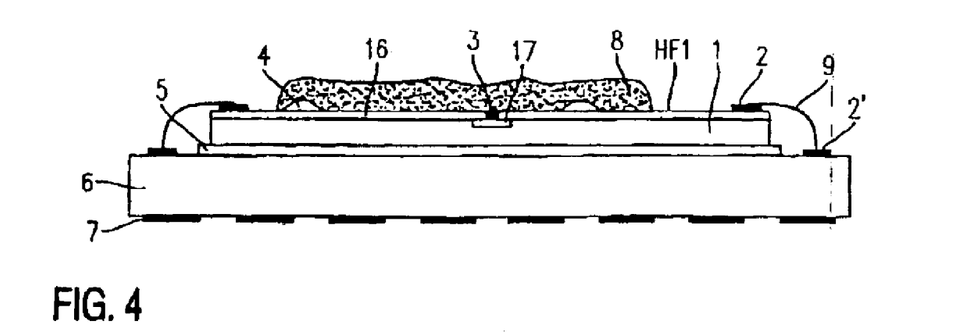
FIG. 4 shows the schematic representation of a cross section of the first chip according to FIG. 1 after a further method step according to a first embodiment of the present invention.

FIG. 4 shows the schematic representation of a cross section of the first chip according to FIG. 1 after a further method step according to a first embodiment of the present invention.

In FIG. 4, the arrangement according to FIG. 3 is represented after the subsequent method step of bonding (wire bonding) the substrate 6 to the circuit device 1. The bonding pads 2' of the substrate 6 are connected in an electrically conducting manner to the bonding pads 2 of the circuit device 1 by means of bonding wires 9.

Figure 5:
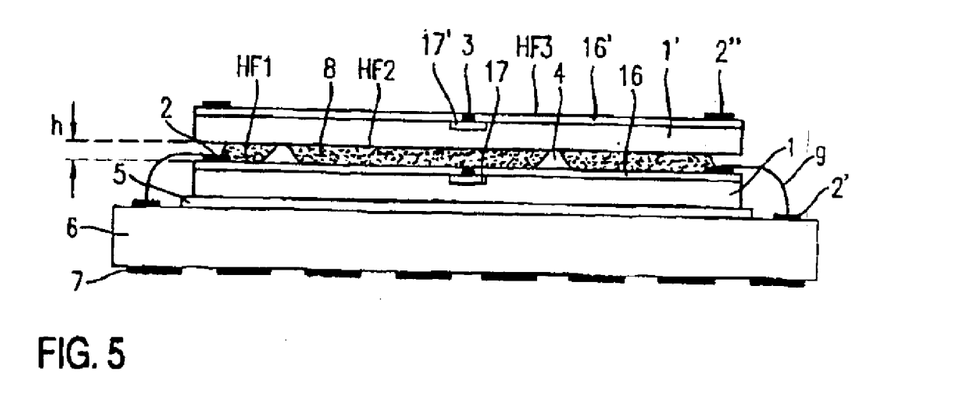
FIG. 5 shows the schematic representation of the mounting of the second chip on the mounted first chip according to FIG. 4 in cross section according to a first embodiment of the present invention.

FIG. 5 shows the schematic representation of the mounting of the second chip on the mounted first chip according to FIG. 4 in cross section according to a first embodiment of the present invention.

Represented in FIG. 5 is a second circuit device 1', which is connected to the first circuit device 1. The spacing h between the two circuit devices 1, 1' is substantially fixed by the spacer device 4. After the alignment and joining together of the two circuit elements 1, 1', the adhesive 8, which is located between the first main area HF1 of the first circuit device 1 and the second main area HF2 of the second circuit device 1', is cured or pre-cured in a curing process, preferably with thermal energy being supplied, whereby the two circuit devices 1, 1' are firmly connected to each other. The second circuit device 1' likewise has contact areas 2" or bonding pads 2" on its surface. The third main area HF3 on the second circuit device 1' is likewise formed by an insulating layer 16', and also provided here is a contact 3, which is connected to the second circuit device 1' by means of a terminal region 17'.

Figure 6:
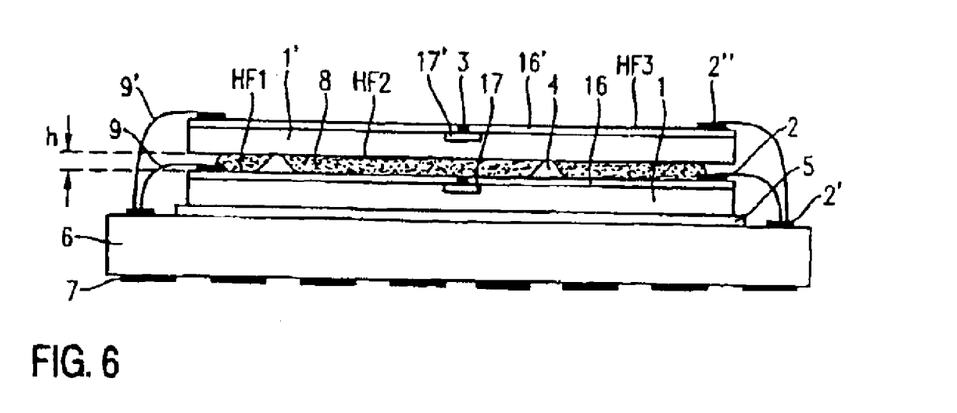
FIG. 6 shows the schematic representation of a cross section of an assembly of the first and the second chip after a further method step according to a first embodiment of the present invention.

FIG. 6 shows the schematic representation of a cross section of an assembly of the first and the second chip after a further method step according to a first embodiment of the present invention.

In FIG. 6, the arrangement according to FIG. 5 is represented, bonding wires 9' for the electrical contacting of the bonding pads 2' of the substrate 6 with the bonding pads 2" of the second circuit device 1' being provided in a further method step.

Figure 7:
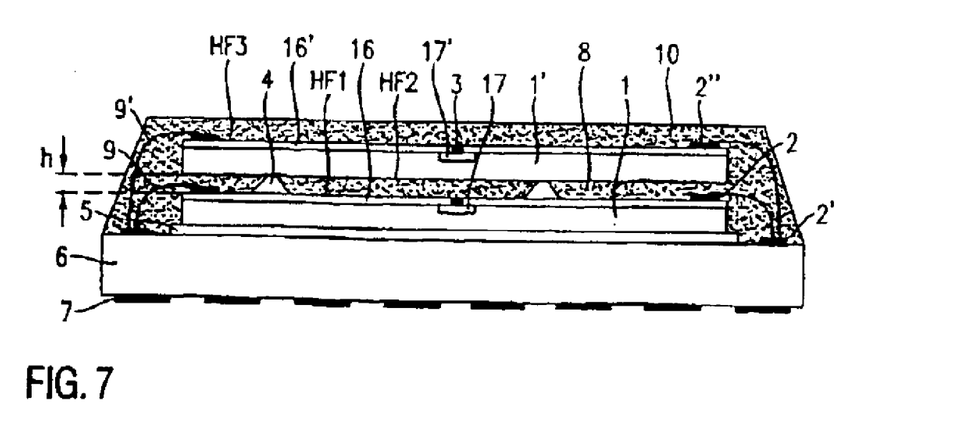
FIG. 7 shows the schematic representation of a cross section through the assembly according to FIG. 6 after the encapsulation of the arrangement according to a first embodiment of the present invention.

FIG. 7 shows the schematic representation of a cross section through the assembly according to FIG. 6 after the encapsulation of the arrangement according to a first embodiment of the present invention.

In FIG. 7, the circuit device according to FIG. 6 is represented after a subsequent method step, in which the arrangement is provided with an encapsulation 10 to protect the circuit devices 1, 1' and the bonding wire connections 9, 9'.

Figure 8:
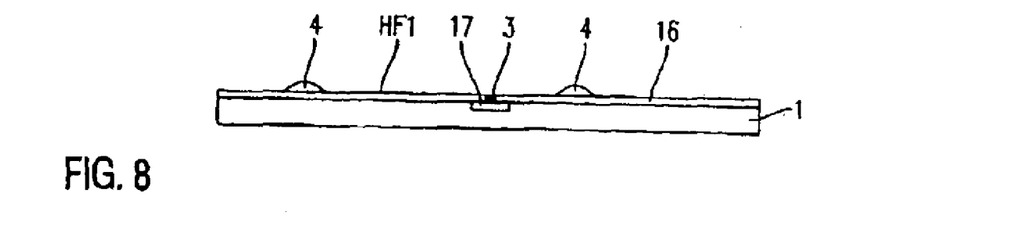
FIGS. 8, 9 show schematic representations of a cross section of the pre-mounting of a chip according to a second embodiment of the present invention.

FIG. 8 shows a schematic representation of a cross section of the pre-mounting of a chip according to a second embodiment of the present invention.

Substantially represented in FIG. 8 is an arrangement according to FIG. 1, although the spacer device 4 or the spacer relief structure 4 consists of a material which has in particular a modulus of elasticity which is lower than that described with reference to FIG. 1, and consequently the spacer device 4 is less rigid and consequently deformable. Suitable as possible materials for this are, for example, silicones or mixed forms of silicone and epoxy. An insulating layer 16 has been applied to a circuit device 1, on the first main area HF1 of which layer the spacer device 4, in particular comprising points 4 or elevations 4, has been applied in a printing process. Instead of epoxy resin, the spacers 4 may, for example, also consist of silicone. The first circuit device 1 is connected by means of a terminal region 17 to a contact 3, which in particular is centrally arranged.

Figure 9:
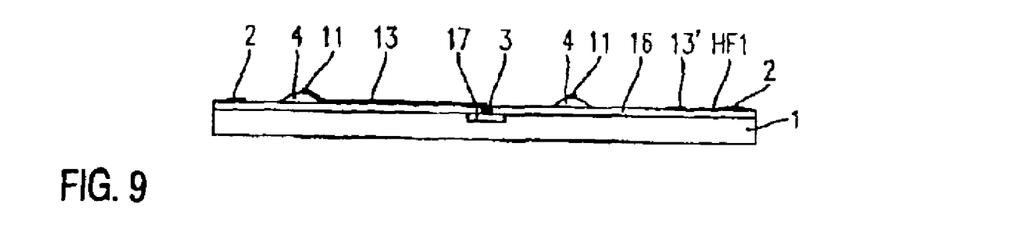

In FIG. 9, the arrangement according to FIG. 8 is represented, although in one or more subsequent process steps conductor tracks 13, 13' or contact areas have been applied, at least a few of which extend over the spacer device 4, and consequently the spacer device 4 has contact areas 11 for the electrical contacting of further circuit devices. The contact areas or conductor tracks 11, 13, 13' preferably comprise layers or layer combinations of the metals titanium, copper, nickel, gold and the metallizations are sputtered on or applied in some other way after a lithographic step.

Figure 10:
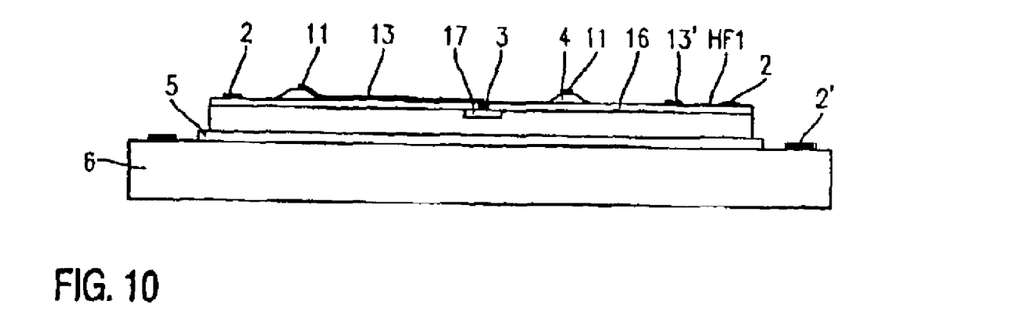
FIGS. 10–12 show schematic representations of a cross section of the pre-mounting of the first chip according to FIG. 8 on a substrate according to the second embodiment of the present invention.

FIG. 10 shows a schematic representation of a cross section of the pre-mounting of the first chip according to FIG. 8 on a substrate according to the second embodiment of the present invention.

In FIG. 10, the arrangement according to FIG. 9 is represented after the mounting of the first circuit device 1 onto a substrate 6, which has rear contact areas 7 (not shown). The substrate 6 has contact areas 2' or bonding pads 2' and is attached to the first circuit device 1 by means of a connecting layer 5. The connecting layer 5 preferably consists of a plastic, such as epoxy resin or silicone for instance.

Figure 11:
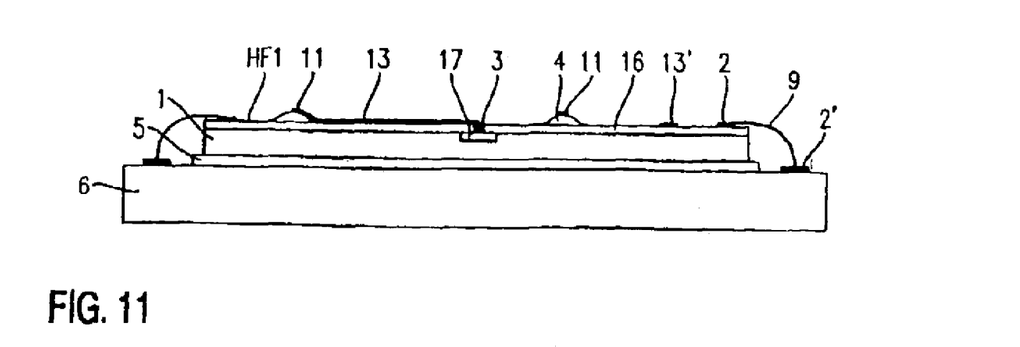

In FIG. 11, the arrangement according to FIG. 10 is represented after a subsequent method step, in which the contact areas 2' of the substrate 6 have been connected to the contact areas 2 or bonding pads 2 of the first circuit device 1 by bonding wires 9.

Figure 12:
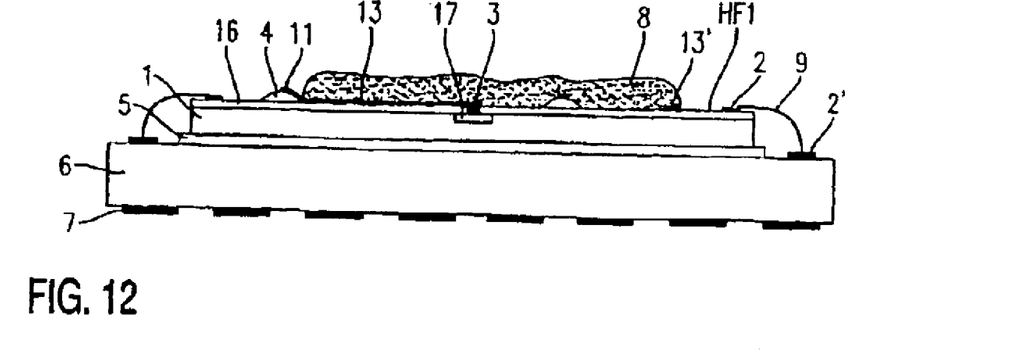

FIG. 12 shows the arrangement according to FIG. 11 after the application of an adhesive 8 to the first main area HF1.

FIGS. 13 to 16 show schematic representations of a cross section of an assembly of the first and second chips according to the second embodiment of the present invention.

Figure 13:
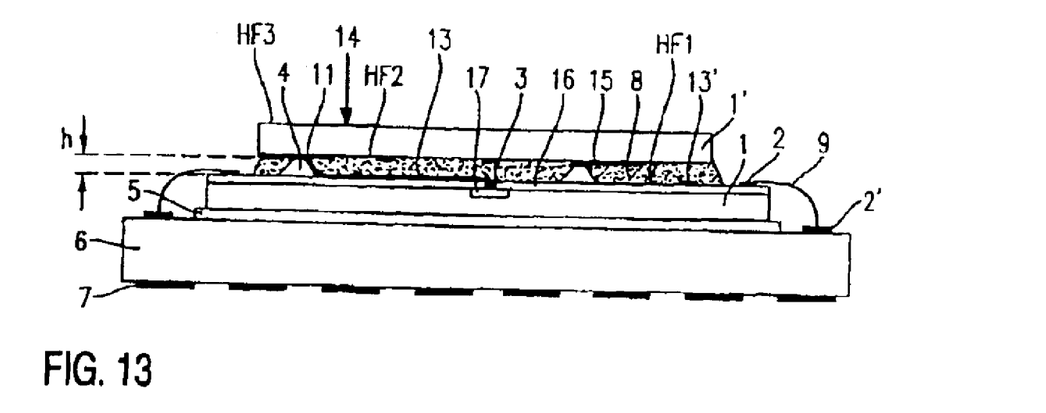
FIGS. 13–16 show schematic representations of a cross section of an assembly of the first and second chips according to the second embodiment of the present invention.

In FIG. 13, the arrangement according to FIG. 12 is represented after the mounting of a second circuit device 1'. The second circuit device 1' has been aligned with respect to the first circuit device 1, so that the two are in a predetermined position in relation to each other. The two are brought to a predetermined spacing h under a predetermined pressure 14, so that metallizations 15 on the second main area HF2 of the second semiconductor device 1' or of the wired contact areas (not represented) on the third main area of an inverted circuit device 1' electrically contact the contact areas 11 on the spacer device 4. The spacer device 4 is preferably slightly deformed for this purpose, in order to ensure good electrical bonding of the lower circuit device 1 to the upper, second circuit device 1'. In the pressed-together state, the arrangement or the adhesive 8 between the first main area HF1 of the first circuit device 1 and the second main area HF2 of the second circuit device 1' or the third main area HF3 of the inverted circuit device 1' (not represented) is cured.

Figure 14:
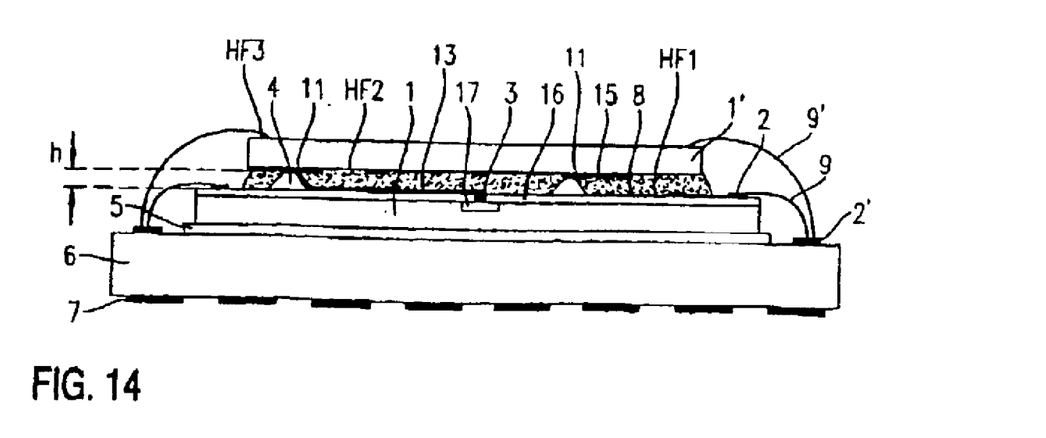

In FIG. 14, the arrangement according to FIG. 13 is represented, the second circuit device 1' being connected to contact areas 2' or bonding pads 2' of the substrate 6 by means of bonding wires 9'.

Figure 15:
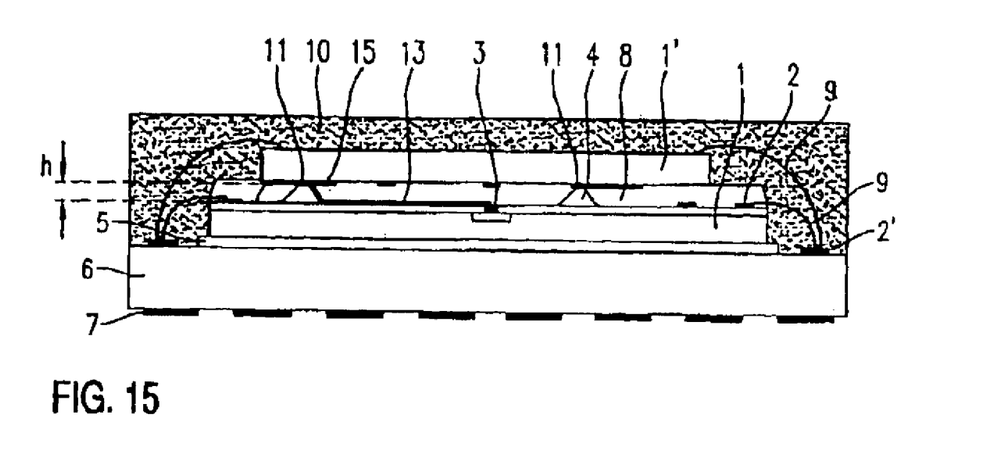

In FIG. 15, the arrangement according to FIG. 14 is represented, a further method step having been provided, that is the enveloping of the first and second circuit devices 1, 1' and their bonding wires 9, 9' in an encapsulation 10, preferably in epoxy resin, to protect the respective devices or elements.

Figure 16:
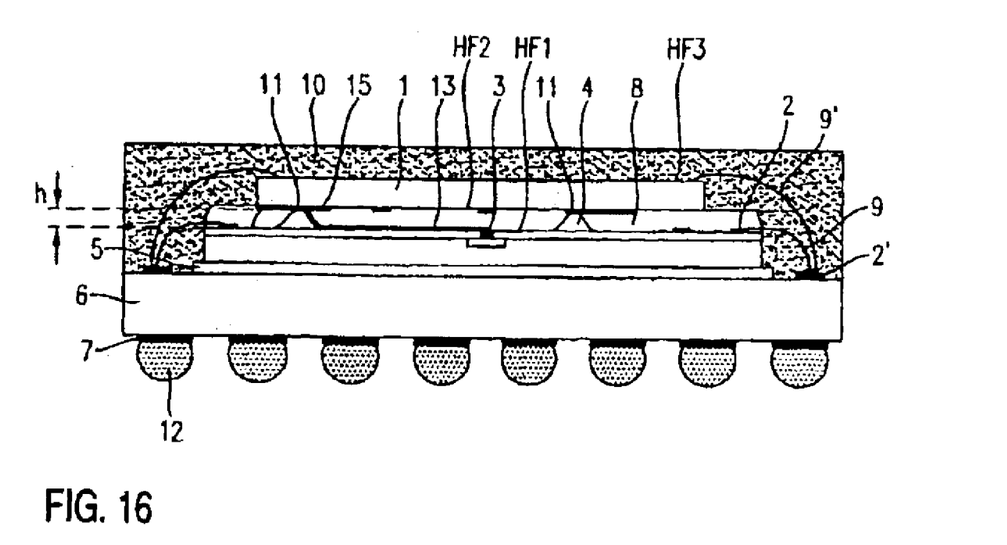

FIG. 16 shows the arrangement according to FIG. 15 after the application of solder balls 12 to the rear contact areas 7 of the substrate 6 to permit the mounting or connection of the encapsulated chip assembly onto or to a customary circuit board or the like.

Figure 17A:
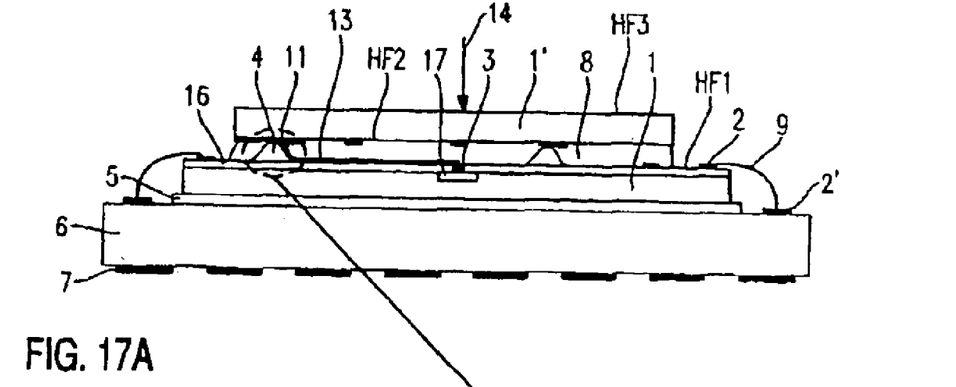
FIGS. 17A–17C show schematic representations of the mounting of the second chip according to FIG. 13 on the mounted first chip according to the second embodiment of the present invention, the representations 17B, 17C representing enlargements of details which reproduce two successive stages of the process.
Figure 17B:
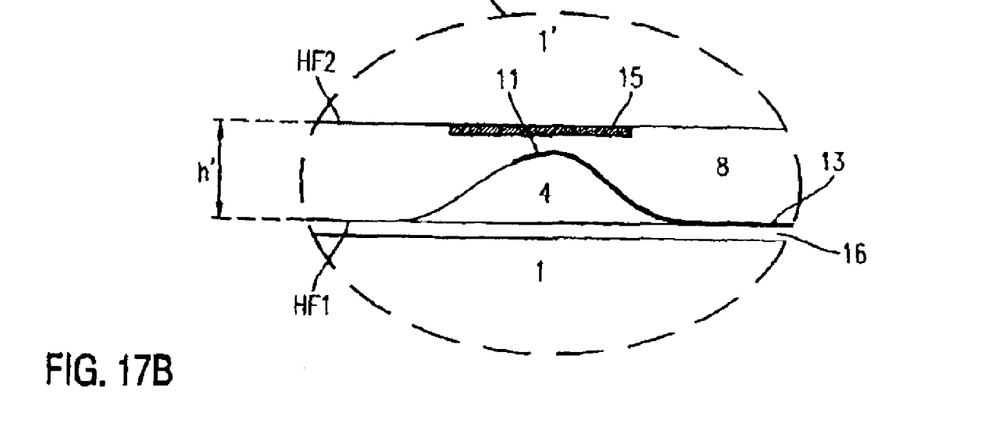
Figure 17C:
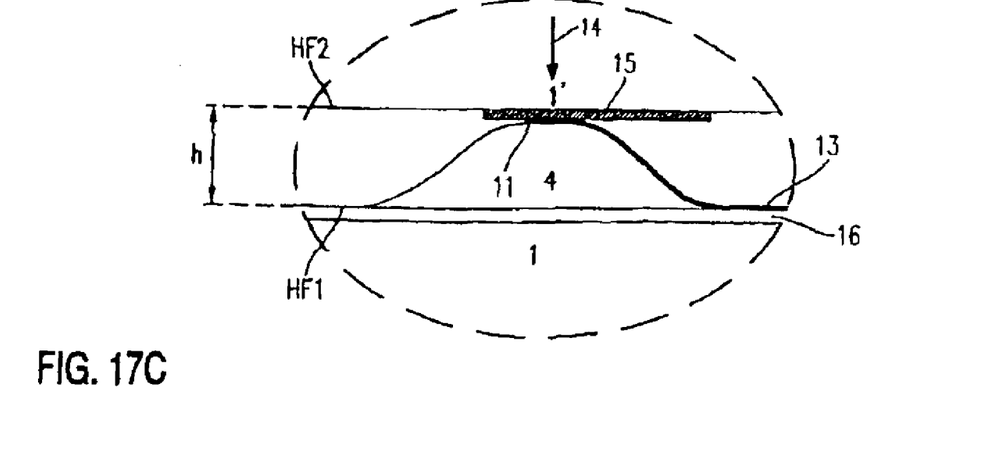

FIGS. 17A–C show schematic representations of the mounting of the second chip according to FIG. 13 on the mounted first chip according to the second embodiment of the present invention, the representations 17B, 17C representing enlargements of details which reproduce two successive stages of the process.

In FIG. 17A, the contacting operation between a contact area 11, which is connected on a spacer 4 by means of a conductor track 13, 13' to a contact 3 of the first circuit device 1 is represented with the aid of the enlargements of details in FIG. 17B and FIG. 17C, which illustrate the result of successive processes.

According to FIG. 17A, the upper, second circuit device 1' is pressed onto the lower first circuit device 1, mounted on the substrate 6, by a predetermined pressure 14. As this happens, the adhesive 8 flows into the entire intermediate space between the circuit elements 1, 1'.

The enlargement of a detail of FIGS. 17B, C explains by using the example of a spacer device 4 the operation of connecting the two circuit elements 1, 1' by the contact area 11 of the first circuit device 1 and the opposing contact area 15 or metallization 15 of the second circuit device 1', which is located in particular on the second main area HF2, i.e. the non-active underside of the second circuit device 1'.

At first, the two contact areas 11 and 15 are spaced apart from each other, since the first circuit device 1 has a spacing of h' with respect to the second circuit device 1', and h' is greater than the height of the spacer device 4. This may also be brought about, for example, by the spacer devices 4 not all having the same height for production reasons. Between the two contact areas 11 and 15 there is also adhesive 8, so that there is no electrical contact between the first circuit device 1 and the second circuit device 1'.

Then, with reference to FIG. 17C, the pressure 14 is applied to the upper, second circuit device 1', so that the adhesive 8 is forced out of the intermediate space between the contact areas 11 and 15, and the latter enter into a conductive connection. In the state according to FIG. 17C, a pre-curing of the adhesive 8 then takes place in order to freeze in the existing state, i.e. the spacing h between the first circuit device 1 and the second circuit device 1', which ensures that the electrical connection is kept under a mechanical prestress.

Figure 18:
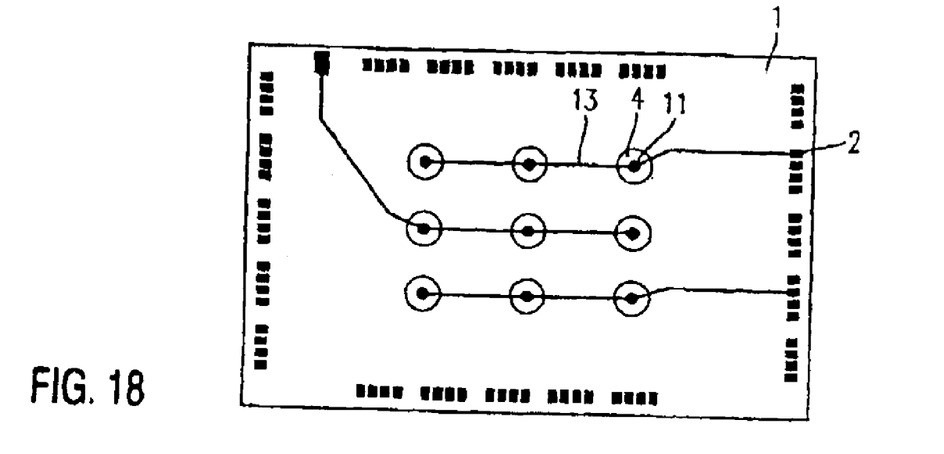
FIG. 18 shows the plan view of a circuit device with wiring devices according to the second embodiment of the present invention.

FIG. 18 shows the plan view of a circuit device with wiring devices according to the second embodiment of the present invention.

Figure 19A:
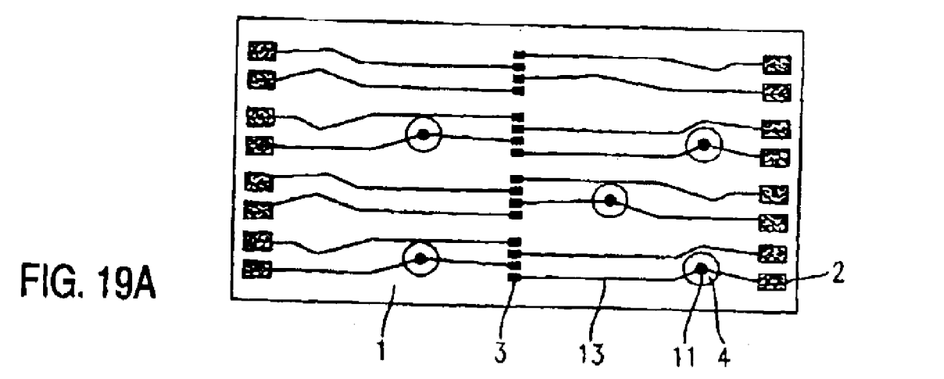
FIGS. 19A, 19B show schematic representations of a circuit device with wiring devices and a central row of contact areas according to the second embodiment of the present invention, FIG. 19A showing a plan view and FIG. 19B showing a cross section.
Figure 19B:
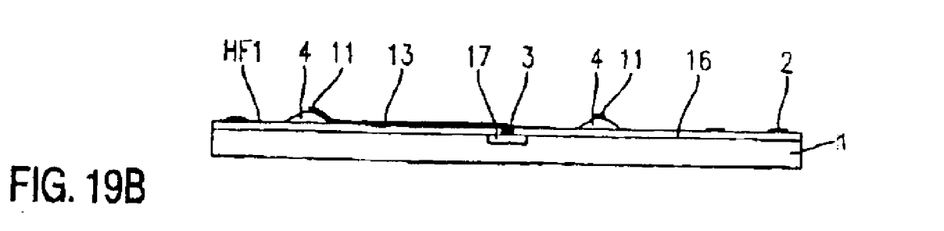

FIGS. 19A, B show schematic representations of a circuit device with wiring devices and a central row of contact areas according to the second embodiment of the present invention, FIG. 19A showing a plan view and FIG. 19B illustrating a cross section.

The method step of pre-curing or curing the adhesive 8 may either be brought about by the device for creating the pressure 14 being a heating plate or heating punch or be performed externally by supplying high-energy radiation.

In this case, parallel processing of a multiplicity of pairs of chips is possible.

Although the present invention has been described above on the basis of a preferred exemplary embodiment, it is not restricted to this, but instead can be modified in various ways.

In particular, the invention is not restricted to single chips, but can also be applied to hybrids, wafers or other integrated circuits. In addition, other materials, such as adhesive instead of epoxy resin for example, or materials for the spacer device are conceivable.

What is claimed as new, and secured by Letters Patent is:

1. A method of connecting a first and second circuit device, the method comprising:
   providing a first circuit device having a first main area;
   providing a second circuit device having a second main area and a third main area;
   providing a spacer device on one of the first and second circuit devices, thereby ensuring a predetermined spacing between the first and second circuit devices;
   applying an adhesive to at least one of the first main area and the second main area;
   aligning the first and second circuit devices;
   joining the first and second circuit devices;
   curing the adhesive,
   providing a first electrical contact on the first main area of the first circuit device;
   providing a second electrical contact on one of the second main area and the third main area of the second circuit device;
   providing a third electrical contact on the spacer device;
   aligning the spacer device such that the second and third electrical contacts are in electrical communication with each other.

2. The method of claim 1, further comprising selecting one of the first and second electrical contacts to be a metallization.

3. The method of claim 1, further comprising selecting one of the first and second electrical contacts to be a conductive track.

4. The method of claim 1, further comprising selecting one of the first and second electrical contacts to be a bonding pad.

5. The method of claim 1, further comprising urging the first and second circuit devices together, thereby causing deformation of the spacer device disposed between the first and second circuit devices.

6. The method of claim 5, wherein curing the adhesive occurs while the spacer device is deformed.

* * * * *